(12) United States Patent
Liu et al.

(10) Patent No.: US 9,882,060 B2
(45) Date of Patent: Jan. 30, 2018

(54) THIN FILM TRANSISTOR AND ARRAY SUBSTRATE, MANUFACTURING METHODS THEREOF, AND DISPLAY DEVICE

(71) Applicant: BOE TECHNOLOGY GROUP CO., LTD., Beijing (CN)

(72) Inventors: Xiaodi Liu, Beijing (CN); Gang Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 14/905,512

(22) PCT Filed: Aug. 11, 2015

(86) PCT No.: PCT/CN2015/086633
§ 371 (c)(1),
(2) Date: Jan. 15, 2016

(87) PCT Pub. No.: WO2016/150073
PCT Pub. Date: Sep. 29, 2016

(65) Prior Publication Data
US 2017/0104102 A1   Apr. 13, 2017

(30) Foreign Application Priority Data
Mar. 24, 2015 (CN) .......................... 2015 1 0129225

(51) Int. Cl.
*H01L 29/786* (2006.01)
*H01L 27/12* (2006.01)
(Continued)

(52) U.S. Cl.
CPC ........ *H01L 29/7869* (2013.01); *H01L 21/385* (2013.01); *H01L 27/1225* (2013.01);
(Continued)

(58) Field of Classification Search
None
See application file for complete search history.

(56) References Cited

FOREIGN PATENT DOCUMENTS

| CN | 101882630 A | 11/2010 |
|---|---|---|
| CN | 102544026 A | 7/2012 |

(Continued)

OTHER PUBLICATIONS

First Office Action dated Mar. 17, 2017 corresponding to Chinese application No. 201510129225.1.
(Continued)

*Primary Examiner* — Michelle Mandala
(74) *Attorney, Agent, or Firm* — Nath, Goldberg & Meyer; Joshua B. Goldberg

(57) ABSTRACT

Embodiments of the present invention disclose a thin film transistor and an array substrate, manufacturing methods thereof, and a display device, which relate to the field of display technology, and can improve drifting of a threshold voltage of a thin film transistor and enhance the stability and reliability of an array substrate. The thin film transistor comprises an active layer and a gate insulating layer, wherein the material of the active layer is a metal oxide semiconductor, and during forming the thin film transistor, the gate insulating layer conveys oxygen to the active layer so as to reduce an interface state density and a movable impurity concentration of a contact interface between the active layer and the gate insulating layer.

24 Claims, 2 Drawing Sheets

(51) Int. Cl.
*H01L 21/385* (2006.01)
*H01L 29/49* (2006.01)
*H01L 29/66* (2006.01)

(52) U.S. Cl.
CPC ...... *H01L 27/1248* (2013.01); *H01L 27/1255* (2013.01); *H01L 29/4908* (2013.01); *H01L 29/66969* (2013.01); *H01L 29/78606* (2013.01); *H01L 29/78696* (2013.01)

(56) References Cited

FOREIGN PATENT DOCUMENTS

| CN | 102939659 A | 2/2013 |
| --- | --- | --- |
| CN | 103231570 A | 8/2013 |
| CN | 103681488 A | 3/2014 |
| CN | 103985764 A | 8/2014 |
| CN | 104037233 A | 9/2014 |
| CN | 104122320 A | 10/2014 |
| CN | 104701383 A | 6/2015 |

OTHER PUBLICATIONS

International Search Report dated Oct. 29, 2015 corresponding to International application No. PCT/CN2015/086633.
Written Opinion of the International Searching Authority dated Oct. 29, 2015 corresponding to International application No. PCT/CN2015/086633.

THIN FILM TRANSISTOR AND ARRAY SUBSTRATE, MANUFACTURING METHODS THEREOF, AND DISPLAY DEVICE

This is a National Phase Application filed under 35 U.S.C. 371 as a national stage of PCT/CN2015/086633, filed Aug. 11, 2015, an application claiming the benefit of Chinese Application No. 201510129225.1, filed Mar. 24, 2015, the content of each of which is hereby incorporated by reference in its entirety.

FIELD OF THE INVENTION

The present invention relates to the field of display technology, in particular to a thin film transistor and an array substrate including the thin film transistor, manufacturing methods thereof, and a display device including the array substrate.

BACKGROUND OF THE INVENTION

An active matrix liquid crystal display includes an array substrate, a color film substrate and a liquid crystal molecule layer located therebetween. Thin film transistors, pixel electrodes and other structures are provided on the array substrate, wherein the thin film transistor includes a gate, an active layer, a gate insulating layer, a source and a drain, and the drain is electrically connected to the pixel electrode.

Specifically, the material of the active layer may be polycrystalline silicon, monocrystalline silicon, amorphous silicon, metal oxide semiconductor or the like. When the material of the active layer is metal oxide semiconductor, the thin film transistor is called an oxide thin film transistor. Since the oxide thin film transistor has advantages of high mobility, low leak current, manufacturability at a low temperature and the like, the oxide thin film transistors is widely applied in array substrates. The material of the gate insulating layer may be silicon oxide, silicon nitride or the like.

The inventor has found that, during the display process of a display, the threshold voltage of the oxide thin film transistor on an array substrate is likely to drift, thereby resulting in poor stability and poor reliability of the array substrate and easily causing poor display of the display.

SUMMARY OF THE INVENTION

One of the objectives of the present invention is to provide a thin film transistor and an array substrate including the thin film transistor, manufacturing methods thereof, and a display device including the array substrate, which may improve drifting of the threshold voltage of the thin film transistor and enhance the stability and the reliability of the array substrate.

To achieve the above objective, an embodiment of the present invention provides a thin film transistor, including an active layer and a. gate insulating layer, wherein the material of the active layer is a metal oxide semiconductor; and during forming the thin film transistor, the gate insulating layer conveys oxygen to the active layer so as to reduce an interface state density and a movable impurity concentration of a contact interface between the active layer and the gate insulating layer.

Preferably, the gate insulating layer includes at least one film layer, and the material of one film layer of the gate insulating layer in contact with the active layer is one of $SiO_x$, $Al_2O_3$, $HfO_2$, $ZrO_2$, $TiO_2$, $Y_2O_3$, $La_2O_3$ and $Ta_2O_5$, where $1.5 \leq x \leq 2.8$; and the material of the active layer is one of IGZO, ZnON, ITZO, ZTO, ZIO, IGO and AZTO, and an oxygen content in a deposition atmosphere during forming the active layer by deposition is less than 20%.

Further preferably, the gate insulating layer includes at least two film layers, wherein the material of one film layer not in contact with the active layer is one of $SiO_x$, $Al_2O_3$, $HfO_2$, $ZrO_2$, $TiO_2$, $Y_2O_3$, $La_2O_3$, $Ta_2O_5$, SiNx and SiON, where $x \leq 2.8$.

Preferably, the thin film transistor further includes an etch stop layer located on a channel region serving as a channel of the active layer.

Preferably, the etch stop layer includes at least one film layer, and the material of each film layer is one of $SiO_x$, SiNx, SiON, $Al_2O_3$ and TEOS, where $x<1.5$.

An embodiment of the present invention provides a thin film transistor, including an active layer and a gate insulating layer, wherein the material of the active layer is a metal oxide semiconductor, and during forming the thin film transistor, the gate insulating layer conveys oxygen to the active layer so as to reduce the interface state density and the movable impurity concentration of a contact interface between the active layer and the gate insulating layer. As a result, drifting of the threshold voltage of the thin film transistor can be improved, the stability and the reliability of an array substrate including the thin film transistor are enhanced, and the display effect of a display device including the array substrate is improved.

In addition, an embodiment of the present invention further provides an array substrate, including any one of the above-mentioned thin film transistors.

Preferably, the array substrate further includes a passivation layer located on the thin film transistor and a transparent conducting layer located on the passivation layer, the passivation layer including at least one film layer.

Preferably, the transparent conducting layer includes a pixel electrode; the array substrate further includes a first via hole penetrating through the passivation layer, and the pixel electrode is electrically connected to the a drain of the thin film transistor through the first via hole.

Further preferably, the passivation layer includes three film layers, the first via hole includes a first portion and a second portion which are provided up and down, the first portion penetrates through two film layers of the passivation layer, the second portion penetrates through one film layer of the passivation layer, and an aspect ratio of the first portion of the first via hole is larger than that of the second portion of the first via hole.

Preferably, a ratio of the aspect ratio of the first portion of the first via hole to the aspect ratio of the second portion of the first via hole is between 1.5 and 5.

Preferably, the transparent conducting layer includes a first wiring located within a peripheral region of the array substrate, the array substrate further includes a second wiring located within the peripheral region and a second via hole penetrating through the passivation layer and the gate insulating layer, the second wiring and a gate of the thin film transistor are provided in a same layer, and the first wiring is electrically connected to the second wiring through the second via hole.

Further preferably, the passivation layer includes three film layers, the second via hole includes a first portion and a second portion which are provided up and down, the first portion penetrates through two film layers of the passivation layer, the second portion penetrates through one film layer of the passivation layer and the gate insulating layer, and a aspect ratio of the first portion of the second via hole is larger than that of the second portion of the second via hole.

Preferably, a ratio of the aspect ratio of the first portion of the second via hole to the aspect ratio of the second portion of the second via hole is between 1.5 and 5.

In addition, an embodiment of the present invention further provides a display device, including any one of the above-mentioned array substrates.

To further solve the technical problem in the prior art, an embodiment of the present invention provides a manufacturing method for a thin film transistor, including the following steps of:

forming a gate metal layer on a base substrate, and then forming a pattern including a gate by a patterning process;

forming a gate insulating layer on the base substrate with the pattern including the gate formed thereon;

forming a metal oxide semiconductor layer on the base substrate with the gate insulating layer formed thereon, and then forming a pattern including an active layer by a patterning process;

forming a source/drain metal layer on the base substrate with the pattern including the active layer formed thereon, and then forming a pattern including a source and a drain by a patterning process, so as to form a thin. film transistor, wherein:

the gate insulating layer conveys oxygen to the active layer so as to reduce an interface state density and a movable impurity concentration of a contact interface between the active layer and the gate insulating layer.

Preferably, the gate insulating layer includes at least one film layer, and the material of one film layer of the gate insulating layer in contact with the active layer is one of $SiO_x$, $Al_2O_3$, $HfO_2$, $ZrO_2$, $TiO_2$, $Y_2O_3$, $La_2O_3$ and $Ta_2O_5$, where $1.5 \leq x \leq 2.8$; and the material of the active layer is one of IGZO, ZnON, ITZO, ZTO, ZIO, IGO and AZTO, the metal oxide semiconductor layer is formed on the base substrate with the gate insulating layer formed thereon by a deposition method, and an oxygen content in a deposition atmosphere during forming the metal oxide semiconductor layer by deposition is less than 20%.

Preferably, the gate insulating layer is formed on the base substrate with the pattern including the gate formed thereon by a chemical vapor deposition method, wherein a ratio of flow rates of $N_2O$ to $SiH_4$ in the deposition atmosphere during forming the gate insulating layer by deposition is larger than 60.

Preferably, the metal oxide semiconductor layer is formed on the base substrate with the gate insulating layer formed thereon by a sputtering deposition method, wherein a ratio of flow rates of $O_2$ to Ar in the deposition atmosphere during forming the metal oxide semiconductor layer by deposition is between 1/20 and 1/7.

Preferably, after forming the pattern including the active layer and before forming the source/drain metal layer, the manufacturing method further include: forming an etch stop film on the base substrate with the pattern including the active layer formed thereon, and then forming an etch stop layer on a channel region serving as a channel of the active layer by a patterning process.

An embodiment of the present invention provides a manufacturing method for a thin film transistor. The manufacturing method includes forming a gate, a gate insulating layer, an active layer, a source and a drain so as to form the thin film transistor, wherein the material of the active layer is a metal oxide semiconductor, and the gate insulating layer conveys oxygen to the active layer so as to reduce the interface state density and the movable impurity concentration of a contact interface between the active layer and the gate insulating layer. As a result, the drifting of the threshold voltage of the thin film transistor can be improved, the stability and the reliability of an array substrate including the thin film transistor are enhanced, and the display effect of a display device including the array substrate is improved.

In addition, an embodiment of the present invention further provides a manufacturing method for an array substrate, including any one of the above-mentioned manufacturing methods for a thin film transistor.

Preferably, the manufacturing method for an array substrate further includes: forming a passivation layer on the base substrate with the thin film transistor formed thereon, the passivation layer including at least one film layer; and forming a transparent conducting film on the base substrate with the passivation layer formed thereon, and then forming a transparent conducting layer by a patterning process.

Preferably, the transparent conducting layer includes a pixel electrode, and after forming the passivation layer and before forming the transparent conducting layer, the manufacturing method further includes: forming a first via hole penetrating through the passivation layer, the pixel electrode being electrically connected to a drain of the thin film transistor through the first via hole.

Further preferably, the passivation layer includes three film layers, and the forming a first via hole penetrating through the passivation layer includes: performing a wet etching on the passivation layer, wherein two film layers of the passivation layer are etched during the wet etching to form a first portion of the first via hole; and performing a dry etching on one film layer of the passivation layer below the first portion of the first via, hole to form a second portion of the first via hole, wherein an aspect ratio of the first portion of the first via hole is larger than that of the second portion of the first via hole.

Preferably, the transparent conducting layer includes a first wiring located within a peripheral region of the array substrate, and a second wiring located within the peripheral region of the array substrate is formed while forming the gate; and after forming the passivation layer and before forming the transparent conducting layer, the manufacturing method further includes: forming a second via hole penetrating through the passivation layer and the gate insulating layer, the first wiring being electrically connected to the second wiring through the second via hole.

Further preferably, the passivation layer includes three film layers, and the forming a second via hole penetrating through the passivation layer and the gate insulating layer includes:

performing a wet etching on the passivation layer, wherein two film layers of the passivation layer are etched during the wet etching to form a first portion of the second via hole; and performing a dry etching on one film layer of the passivation layer below the first portion of the second via hole and the gate insulating layer to form a second portion of the second via hole;

wherein an aspect ratio of the first portion of the second via hole is larger than that of the second portion of the second portion.

Preferably, after forming the transparent conducting layer, the manufacturing method further includes:

annealing the array substrate.

Preferably, the annealing temperature is between 120° C. and 450° C., the annealing time is between 0.5 and 3 hours, and the annealing environment is vacuum, nitrogen, air or oxygen.

BRIEF DESCRIPTION OF THE DRAWINGS

To describe the technical solutions in the embodiments of the present invention or in the prior art more clearly, the accompanying drawings to be used in the description of embodiments will be briefly described below. Apparently, the accompanying drawings described hereinafter are merely some embodiments of the present invention, and a person of ordinary skill in the art may further obtain other accompanying drawings according to these accompanying drawings without any creative work.

REFERENCE NUMERALS

1: base substrate; 2: gate; 3: gate insulating layer; 4: active layer;
5: source; 6: drain; 7: etch stop layer; 8: passivation layer;
9: first via hole; 91: first portion of first via hole;
92: second portion of first via hole; 10: pixel electrode; 11: first wiring;
12: second wiring; 13: second via hole;
131: first portion of second via hole;
132: second portion of second via hole.

DETAILED DESCRIPTION OF THE EMBODIMENTS

The technical solutions in the embodiments of the present invention will be clearly and completely described below with reference to the accompanying drawings in the embodiments of the present invention. Apparently, the embodiments described herein are a part of but not all of the embodiments of the present invention. All other embodiments obtained by a person of ordinary skill in the art based on the embodiments in the present invention and without any creative work fall within the protection scope of the present invention, First Embodiment This embodiment of the present invention provides a thin film transistor, which can improve drifting of the threshold voltage of the thin film transistor and enhance the stability and reliability of an array substrate including the thin film transistor.

Figure 1:
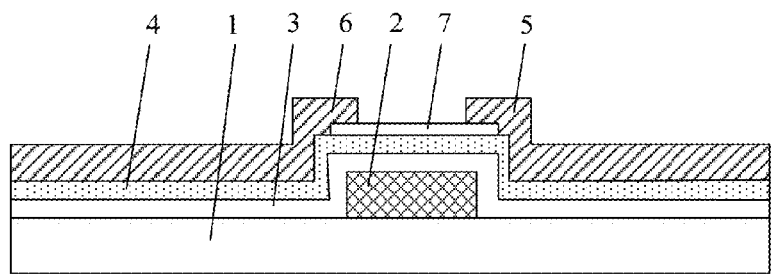
FIG. 1 is structural diagram of a. thin film transistor according to an embodiment of the present invention.

Specifically, as shown in FIG. 1, the thin film transistor includes an active layer 4 and a gate insulating layer 3. The material of the active layer 4 is a metal oxide semiconductor. During forming the thin film transistor, the gate insulating layer 3 conveys oxygen to the active layer 4 to reduce an interface state density and a movable impurity concentration of a contact interface between the active layer 4 and the gate insulating layer 3. As a result, drifting of the threshold voltage of the thin film transistor can be improved, and the stability and reliability of an array substrate including the thin film transistor are enhanced.

Specifically, the gate insulating layer 3 may include at least one film layer, wherein the material of one film layer of the gate insulating layer 3 in contact with the active layer 4 is one of $SiO_x$, $Al_2O_3$, $HfO_2$, $ZrO_2$, $TiO_2$, $Y_2O_3$, $La_2O_3$ and $Ta_2O_5$, where $1.5 \leq x \leq 2.8$. The material of the active layer 4 is one of IGZO, ZnON, ITZO, ZTO, ZIO, IGO and AZTO, and the oxygen content in a deposition atmosphere during forming the active layer 4 by deposition is less than 20%. Thus, the oxygen content of the film layer of the gate insulating layer 3 in contact with the active layer 4 is high, while the oxygen content of the active layer 4 is low. During the subsequent annealing process, the film layer of the gate insulating layer 3 in contact with the active layer 4 can convey oxygen to the active layer 4. The contact interface between the gate insulating layer 3 and the active layer 4 is in an oxygen-enriched state, As the content of bonded oxygen and free oxygen in the interface is high, the interface state density and the movable impurity concentration can be effectively reduced, and it is advantageous for the enhancement of the stability and reliability of a device. Furthermore, as the film layer of the gate insulating layer 3 in contact with the active layer 4 conveys oxygen to the active layer 4, oxygen vacancies in the active layer 4 can also be replenished, so that drifting of the threshold voltage of the thin film transistor is further improved, and the stability and reliability of an array substrate including the thin film transistor are further enhanced.

However, in the prior art, the material of the gate insulating layer is generally $SiO_x$, where $x<1.5$; and the material of the active layer is one of IGZO, ZnON, ITZO, ZTO, ZIO, IGO and AZTO. Therefore, the oxygen contents of both the gate insulating layer and the active layer formed in the prior art are low, so that the gate insulating layer will not convey oxygen to the active layer to make the contact interface between the gate insulating layer and the active layer be in an oxygen-enriched state. As a result, the interface state density and the movable impurity concentration of the contact interface between the gate insulating layer and the active layer are high, and drifting of the threshold voltage of the thin film transistor is serious. Moreover, in the prior art, during forming the active layer by deposition, the oxygen content in a deposition atmosphere is larger than or equal to 20%. Hence, in the case where the oxygen contents of the formed gate insulating layer and active layer are low, the oxygen content in the formed active layer may be higher than that of the gate insulating layer, so that the oxygen in the active layer is likely to enter the gate insulating layer to realize an oxygen balance between the active layer and the gate insulating layer. Consequently, oxygen vacancies will be formed in the active layer, so that drifting of the threshold voltage of the thin film transistor becomes more serious, and the stability and reliability of an array substrate including the thin film transistor are poor.

Further, the gate insulating layer 3 includes at least two film layers, wherein the material of one film layer not in contact with the active layer 4 is one of $SiO_x$, $Al_2O_3$, $HfO_2$, $ZrO_2$, $TiO_2$, $Y_2O_3$, $La_2O_3$, $Ta_2O_5$, $SiN_x$ and SiON, where $x \leq 2.8$.

In addition, as shown in FIG. 1, the thin film transistor further includes a gate 2 located below the gate insulating layer 3, and a source 5 and a drain 6 both connected to the active layer 4, wherein the source 5 and the drain 6 are located above the active layer 4. Therefore, to prevent influence on the performance of a channel region serving as a. channel of the active layer 4 during patterning the source 5 and the drain 6, in this embodiment of the present invention, the thin film transistor preferably further includes an etch stop layer 7 located on the channel region serving as a channel of the active layer 4.

Specifically, the etch stop layer 7 may include at least one film layer. The material of each film layer is one of SiOx, SiNx, SiON, $Al_2O_3$ and TEOS, where x<1.5. The material of the gate 2, the source 5 and the drain 6 may be Mo, Al/Nd, Al/Nd/Mo, Mo/Al/Nd/Mo, Au/Ti, Pt/Ti or other metal or alloy.

In addition, the thin film transistor in this embodiment of the present invention further includes a base substrate 1 for supporting the gate 2, the gate insulating layer 3, the active layer 4, the source 5, the drain 6 and the etch stop layer 7, wherein the base substrate 1 may be a glass substrate, a plastic substrate (e.g., a polyimide substrate), a silicon substrate or the like.

Figure 2:
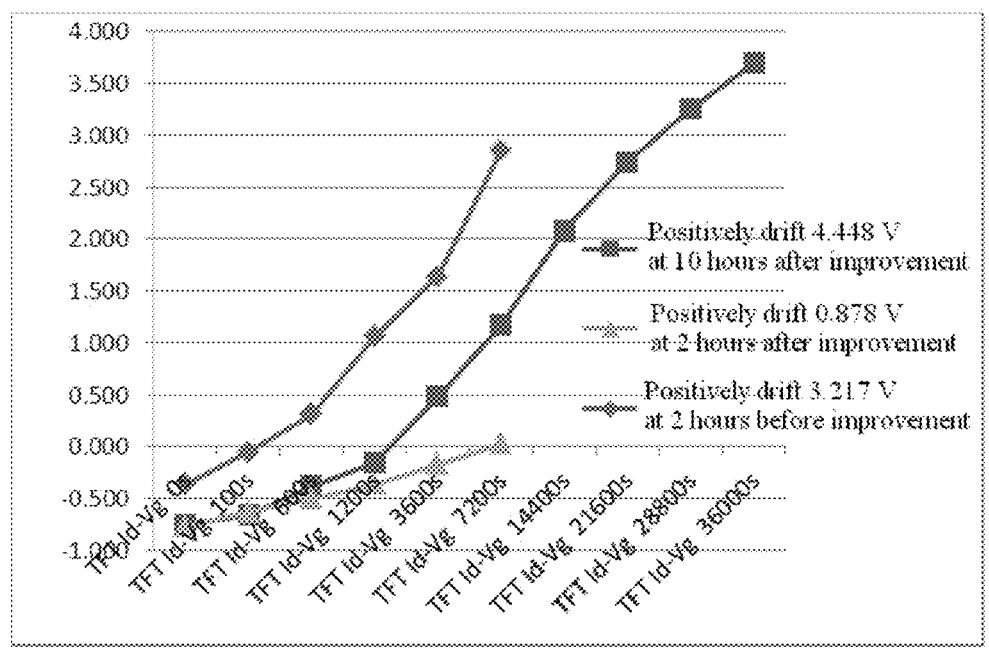
FIG. 2 is a schematic diagram of relationships between the time and the drift amounts of threshold voltages of thin film transistors in the embodiment of the present invention and in the prior art.

FIG. 2 is a schematic diagram of relationship between the time and the drift amounts of threshold voltages of the thin film transistor in this embodiment of the present invention (after improvement in this figure) and a thin film transistor in the prior art (before improvement in this figure) under a positive-pressure stress test at a high temperature of 80° C. Specifically, as shown in FIG. 2, after two hours' testing of the thin film transistor in the prior art, the threshold voltage positively drifts 3.217 V; however, after two hours' testing of the thin film transistor in this embodiment of the present invention, the threshold voltage positively drifts 0.878 V only, which is about a quarter of the drift amount of the threshold voltage of the thin film transistor in the prior art, and after ten hours' testing, the threshold voltage positively drifts 4.448 V. It can be seen from FIG. 2 that the reliability and stability of the thin film transistor provided by this embodiment of the present invention is much better than the thin film transistor in the prior art.

This embodiment of the present invention provides a thin film transistor, including an active layer 4 and a. gate insulating layer 3, wherein the material of the active layer 4 is a metal oxide semiconductor; and during forming the thin film transistor, the gate insulating layer 3 conveys oxygen to the active layer 4 so as to reduce the interface state density and the movable impurity concentration of a contact interface between the active layer 4 and the gate insulating layer 3. As a result, drifting of the threshold voltage of the thin film transistor can be improved, the stability and reliability of an array substrate including the thin film transistor are enhanced, and the display effect of a display device including the array substrate is improved.

Second Embodiment

Figure 3:
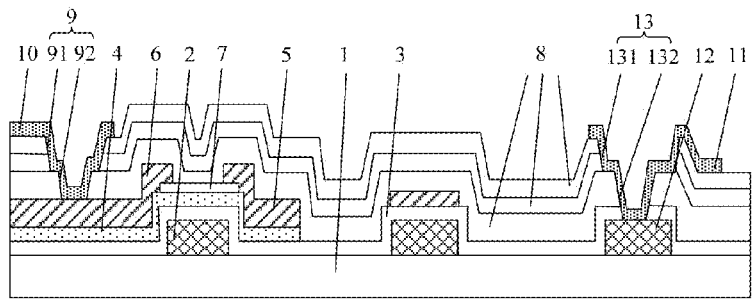
FIG. 3 is a structural diagram of an array substrate according to an embodiment of the present invention.

This embodiment of the present invention provides an array substrate. As shown in FIG. 3, the array substrate includes any thin film transistor provided. in the first embodiment.

Specifically, as shown in FIG. 3, the array substrate further includes a passivation layer 8 located on the thin film transistor and a transparent conducting layer located on the passivation layer 8, wherein the passivation layer 8 includes at least one film layer.

Exemplarily, the material of each film layer included in the passivation layer 8 may be one of SiOx, SiNx, SiON and $Al_2O_3$, where x<1.5. The material of the transparent conducting layer is ITO.

Optionally, as shown in FIG. 3, the transparent conducting layer includes a pixel electrode 10. In this case, the array substrate further includes a first via hole 9 penetrating through the passivation layer 8, and the pixel electrode 10 is electrically connected to the drain 6 of the thin film transistor through the first via hole 9.

Further, as shown in FIG. 3, when the passivation layer 8 includes three film layers, the first via hole 9 includes a first portion 91 and a second portion 92 which are provided up and down, wherein the first portion 91 penetrates through two film layers of the passivation layer 8, and the second portion 92 penetrates through one film layer of the passivation layer 8. An aspect ratio (a ratio of the opening width to depth of a via hole is defined as the aspect ratio) of the first portion 91 is larger than that of the second portion 92, so the side wall of the first via hole 9 is step-like. As the angle of inclination of the side wall is small, the gradeability of the pixel electrode 10 is improved, so that the probability of occurrence of line breakage can be effectively reduced and the performance and yield of the array substrate are improved.

Further, a ratio of the aspect ratio of the first portion 91 of the first via hole 9 to the aspect ratio of the second portion 92 of the first via hole 9 is between 1.5 and 5.

Optionally, as shown in FIG. 3, the transparent conducting layer includes a first wiring 11 located within a peripheral region of the array substrate, and the array substrate further includes a second wiring 12 located within the peripheral region and a second via hole 13 penetrating through the passivation layer 8 and the gate insulating layer 3. The second wiring 12 and the gate 2 of the thin film transistor are provided in a same layer, and the first wiring 11 is electrically connected to the second wiring 12 through the second via hole 13.

Further, as shown in FIG. 3, when the passivation layer 8 includes three film layers, the second via hole 13 includes a first portion 131 and a second portion 132 which are provided up and down. The first portion 131 penetrates through two film layers of the passivation layer 8, and the second portion 132 penetrates through one film layer of the passivation layer 8 and the gate insulating layer 3. An aspect ratio of the first portion 131 is larger than that of the second portion 132, so the side wall of the second via hole 13 is step-like. As the angle of inclination of the side wall is small, the gradeability of the first wiring 11 is improved, so that the probability of occurrence of line breakage can be effectively reduced and the performance and yield of the array substrate are improved.

Further, a ratio of the aspect ratio of the first portion 131 of the second via hole to the aspect ratio of the second portion 132 of the second via hole is between 1.5 and 5.

In addition, as shown in FIG. 3, the array substrate provided by this embodiment of the present invention may further include a first structure provided in the same layer as the gate 2 and a second structure provided in the same layer as the source 5 and the drain 6. Exemplarily, the first structure and the second structure may be wirings located within the peripheral region of the array substrate, respectively; or, the first structure and the second structure have an intersection region, and their intersection may serve as a capacitor.

In addition, this embodiment of the present invention further provides a display device, including the array substrate described above. Specifically, the display device may be: a liquid crystal panel, electronic paper, an organic light-emitting display panel, a mobile phone, a tablet computer, a TV set, a display, a notebook computer, a digital photo frame, a navigator or any other product or component having a display function.

Third Embodiment

Figure 4:
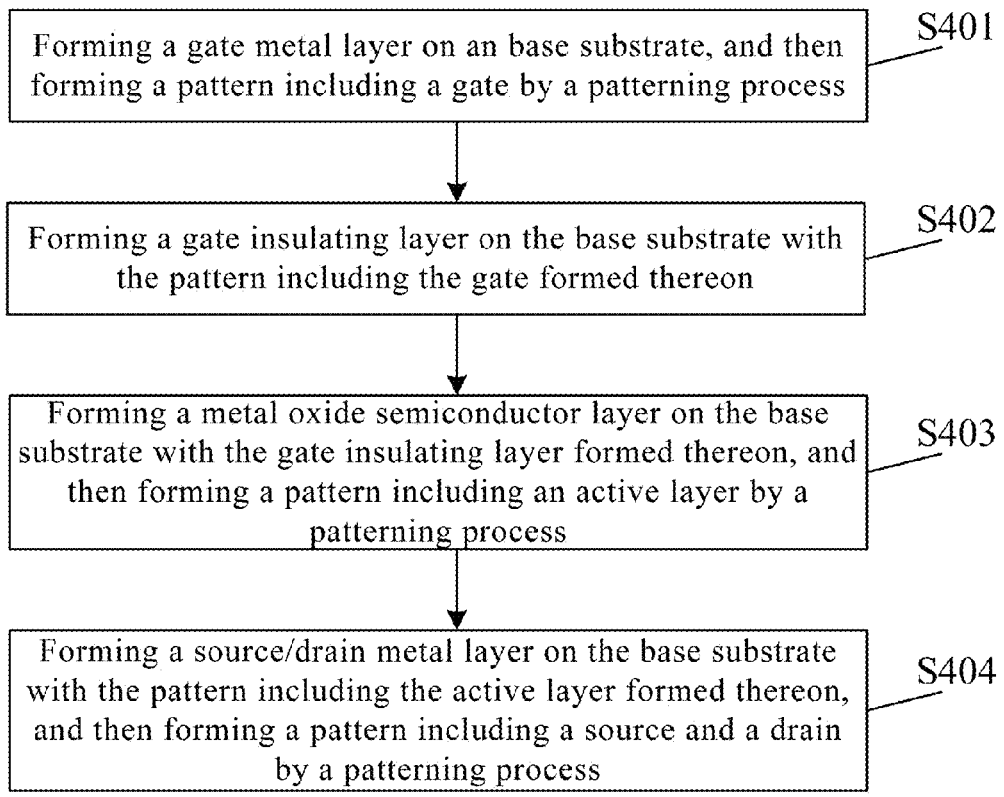
FIG. 4 is a manufacturing flowchart of a thin film transistor according to an embodiment of the present invention.

This embodiment of the present invention provides a manufacturing method for the thin film transistor provided in the first embodiment. Specifically, as shown in FIG. 4, the manufacturing method for the thin film transistor includes the following steps S401 to S404.

In step S401, a gate metal layer is formed on a base substrate, and then a pattern including a gate is formed by a patterning process.

Specifically, as shown in FIG. 1, the gate metal layer is formed on the base substrate 1 by sputtering or other method, and then the pattern including the gate 2 is formed by a patterning process.

In step S402, a gate insulating layer is formed on the base substrate with the pattern including the gate formed thereon.

Specifically, as shown in FIG. 1, the gate insulating layer 3 is formed on the base substrate 1 with the pattern including the gate 2 formed thereon by normal-pressure chemical vapor deposition, low-pressure chemical vapor deposition, plasma assisted chemical vapor deposition, sputtering or other method.

In step S403, a metal oxide semiconductor layer is formed on the base substrate with the gate insulating layer formed thereon, and then a pattern including an active layer is formed by a patterning process.

Specifically, as shown in FIG. 1, the metal oxide semiconductor layer is formed on the base substrate 1 with the gate insulating layer 3 formed thereon by sputtering, sol-gel, vacuum evaporation, spray coating, ink-jet printing or other method, and then the pattern including the active layer 4 is formed by a patterning process.

In step S404, a source/drain metal layer is formed on the base substrate with the pattern including the active layer formed thereon, and then a pattern including a source and a drain is formed by a patterning process, so as to form the thin film transistor.

Specifically, as shown in FIG. 1, the source/drain metal layer is formed on the base substrate 1 with the pattern including the active layer 4 formed thereon by sputtering or other method, and then the pattern including the source 5 and the drain 6 is formed by a patterning process, so as to form the thin film transistor.

During the manufacturing process, the gate insulating layer 3 conveys oxygen to the active layer 4 so as to reduce the interface state density and the movable impurity concentration of a contact interface between the active layer 4 and the gate insulating layer 3. As a result, drifting of the threshold voltage of the thin film transistor can be improved, the stability and reliability of an array substrate including the thin film transistor are enhanced, and the display effect of a display device including the array substrate is improved.

Specifically, the gate insulating layer 3 includes at least one film layer, and the material of one film layer of the gate insulating layer 3 in contact with the active layer 4 is one of $SiO_x$, $Al_2O_3$, $HfO_2$, $ZrO_2$, $TiO_2$, $Y_2O_3$, $La_2O_3$ and $Ta_2O_5$, where $1.5 \leq x \leq 2.8$. The material of the active layer 4 is one of IGZO, ZnON, ITZO, ZTO, ZIO, IGO and AZTO. The metal oxide semiconductor layer is formed on the base substrate 1 with the gate insulating layer 3 formed thereon by a deposition method, wherein the oxygen content in a deposition atmosphere during forming the metal oxide semiconductor layer by deposition is less than 20%. Thus, the oxygen content of the film layer of the gate insulating layer 3 in contact with the active layer 4 is high, while the oxygen content of the active layer 4 is low. As a result, during the subsequent annealing process, the film layer of the gate insulating layer 3 in contact with the active layer 4 can convey oxygen to the active layer 4. The contact interface between the gate insulating layer 3 and the active layer 4 is in an oxygen-enriched state. As the contents of bonded oxygen and free oxygen in the interface are high, the interface state density and the movable impurity concentration can be effectively reduced, and it is advantageous for the enhancement of the stability and reliability of a device. Furthermore, as the film layer of the gate insulating layer 3 in contact with the active layer 4 conveys oxygen to the active layer 4, oxygen vacancies in the active layer 4 can be replenished, so that drifting of the threshold voltage of the thin film transistor is further improved, and the stability and reliability of an array substrate including the thin film transistor are further enhanced.

Optionally, in this embodiment of the present invention, the gate insulating layer 3 is formed on the base substrate 1 with the pattern including the gate 2 formed thereon by a chemical vapor deposition method, wherein a ratio of flow rates of $N_2O$ to $SiH_4$ in the deposition atmosphere during forming the gate insulating layer 3 by deposition is larger than 60, so that the oxygen content of the formed gate insulating layer 3 is high.

In this embodiment of the present invention, the metal oxide semiconductor layer is formed on the base substrate 1 with the gate insulating layer 3 formed thereon by a sputtering deposition method, and then the pattern including the active layer 4 is formed by a patterning process, wherein, optionally, a ratio of flow rates of $O_2$ to Ar in the deposition atmosphere during forming the metal oxide semiconductor layer by deposition is between 1/20 and 1/7, so that the oxygen content of the formed active layer 4 is low.

In addition, to prevent influence on the performance of a channel region serving as a channel of the active layer 4 during patterning the pattern including the source 5 and the drain 6, in this embodiment of the present invention, preferably, after forming the pattern including the active layer 4 and before forming the source/drain metal layer, the manufacturing method further includes: forming an etch stop film on the base substrate 1 with the pattern including the active layer 4 formed thereon, and then forming an etch stop layer 7 on a channel region serving as a channel of the active layer 4 by a patterning process.

This embodiment of the present invention provides a manufacturing method for a thin film transistor. The manufacturing method includes forming a gate, a gate insulating layer, an active layer, a source and a drain on the base substrate so as to form the thin film transistor, wherein the material of the active layer is a metal oxide semiconductor, and the gate insulating layer conveys oxygen to the active layer so as to reduce the interface state density and the movable impurity concentration of a contact interface between the active layer and the gate insulating layer. As a result, drifting of the threshold voltage of the thin film transistor can be improved, the stability and reliability of an array substrate including the thin film transistor are enhanced, and the display effect of a display device including the array substrate is improved.

Fourth Embodiment

In addition, this embodiment of the present invention further provides a manufacturing method for the array substrate provided in the second embodiment. The manufacturing method for the array substrate includes the manufacturing method for a thin film transistor provided in the third embodiment.

Further, the manufacturing method for the array substrate further includes the following steps S501 to S502.

In step S501, a passivation layer is formed on the base substrate with the thin film transistor formed thereon, the passivation layer including at least one film layer.

Specifically, the passivation layer 8 is continuously grown on the base substrate with the thin film transistor formed thereon by thermal growth, normal-pressure chemical vapor deposition, low-pressure chemical vapor deposition, plasma assisted chemical vapor deposition, sputtering or other method, as shown in FIG. 3.

It is to be noted that, in the prior art, the array substrate is generally annealed after the passivation layer 8 is formed on the base substrate 1 with the thin film transistor formed thereon. Exemplarily, the annealing environment is oxygen, nitrogen or vacuum, the annealing temperature is above 200° C., and the annealing time is 2 to 3 hours. However, the inventor has found that, when the thin film transistor is manufactured by the manufacturing method provided in the third embodiment, if the array substrate is annealed for a time shorter than that in the prior art or not annealed after the passivation layer 8 is formed, it can be more advantageous for the control of an oxygen distribution of the contact interface, thereby achieving the purpose of improving the homogeneity, stability and reliability of the array substrate. Therefore, in this embodiment of the present invention, it is preferable not to anneal the array substrate after the passivation layer 8 is formed. On the one hand, the homogeneity, stability and reliability of the array substrate are improved; and on the other hand, the manufacturing process of the array substrate may be simplified, and the cost is saved.

In step S502, a. transparent conducting film is formed on the base substrate with the passivation layer formed thereon, and then a transparent conducting layer is formed by a patterning process.

Specifically, the transparent conducting film is formed on the base substrate 1 with the passivation layer 8 formed thereon by a sputtering method, and then the transparent conducting layer is formed by a patterning process.

Optionally, when the transparent conducting layer includes a pixel electrode 10, in this embodiment of the present invention, after forming the passivation layer 8 and before forming the transparent conducting layer, the manufacturing method preferably further includes: forming a first via hole 9 penetrating through the passivation layer 8 so that the pixel electrode 10 is electrically connected to the drain 6 of the thin film transistor through the first via hole 9.

When the passivation layer 8 includes three film layers, forming a first via hole 9 penetrating through the passivation layer 8 specifically includes: first, performing a wet etching on the passivation layer 8, wherein two film layers of the passivation layer 8 are etched during the wet etching to form a first portion 91 of the first via hole 9; and then, performing a dry etching on one film layer of the passivation layer 8 below the first portion 91 of the first via hole 9 to form a second portion 92 of the first via hole 9.

In this embodiment, an aspect ratio of the first portion 91 of the first via hole 9 is larger than that of the second portion 92 of the first via, hole 9, so that the side wall of the first via hole 9 is step-like. As the angle of inclination of the side wall is small, the gradeability of the pixel electrode 10 is improved, so that the probability of occurrence of line breakage can be effectively reduced and the performance and yield of the array substrate are improved.

Optionally, when the transparent conducting layer includes a first wiring 11 located within a peripheral region of the array substrate, and a second wiring 12 located within the peripheral region of the array substrate is formed while forming the gate 2, in this embodiment of the present invention, preferably, after forming the passivation layer 8 and before forming the transparent conducting layer, the manufacturing method further includes: forming a second via hole 13 penetrating through the passivation layer 8 and the gate insulating layer 3, the first wiring 11 being electrically connected to the second wiring 12 through the second via hole 13.

When the passivation layer 8 includes three film layers, forming a second via hole 13 penetrating through the passivation layer 8 and the gate insulating layer 3 specifically includes the following steps of: first, performing a wet etching on the passivation layer 8, wherein two film layers of the passivation 8 are etched during the wet-drying to form a first portion 131 of the second via hole 13; and then, performing a dry etching on one film layer of the passivation layer 8 below the first portion 131 of the second via hole 13 and the gate insulating layer 3 to form a second portion 132 of the second via hole 13.

In this embodiment, an aspect ratio of the first portion 131 of the second via hole 13 is larger than that of the second portion 132 of the second via hole 13, so that the side wall of the second via hole 13 is step-like. As the angle of inclination of the side wall is small, the gradeability of the first wiring 11 is improved, so that the probability of occurrence of line breakage can be effectively reduced and the performance and yield of the array substrate are improved.

In addition, after forming the transparent conducting layer, the manufacturing method for an array substrate in this embodiment of the present invention further includes: annealing the array substrate to reduce the number of defects in the active layer 4.

Exemplarily, the annealing temperature is between 120° C. and 450° C., the annealing time is between 0.5 and 3 hours, and the annealing environment is vacuum, nitrogen, air or oxygen.

The above embodiment merely shows the process of separately forming the first via hole 9 and the second via hole 13. However, further, to simplify the manufacturing process of the array substrate and save cost, the first via hole 9 and the second via hole 13 may be formed simultaneously. However, as the depth of the first via hole 9 is less than that of the second via hole 13, to simultaneously form the first via hole 9 and the second via hole 13, the first portion of the first via hole 9 and the first portion of the second via hole 13 may be simultaneously formed by wet etching first. During this process, for example, a proper adjustment may be carried out and the opening size of the first via hole 9 is allowed to be less than the opening size of the second via hole 13 so that the depth of the first portion of the first via hole 9 is less than that of the first portion of the second via hole 13. Then, the second portion of the first via hole 9 and the second portion of the second via hole 13 are formed by dry etching. The opening size of the first via hole 9 and the opening size of the second via hole 13 are properly adjusted during the wet etching process, so that the second portion of the first via hole 9 and the second portion of the second via hole 13 are also simultaneously formed.

Described above are merely specific implementations of the present invention, but the protection scope of the present invention is not limited thereto. Any variation or substitution readily conceivable to those skilled in the art within the technical scope disclosed by the present invention shall fall within the protection scope of the present invention. Thus, the projection scope of the present invention shall be subject to the protection scope defined by the appended claims.

The invention claimed is:

1. A thin film transistor, comprising an active layer and a gate insulating layer, the material of the active layer being a metal oxide semiconductor, wherein during forming the thin film transistor, the gate insulating layer conveys oxygen to the active layer so as to reduce an interface state density and a movable impurity concentration of a contact interface between the active layer and the gate insulating layer, and the thin film transistor further comprises an etch stop layer located on a channel region serving as a channel of the active layer.

2. The thin film transistor according to claim 1, wherein the gate insulating layer comprises at least one film layer, and the material of one film layer of the gate insulating layer in contact with the active layer is one of SiOx, Al2O3, HfO2, ZrO2, TiO2, Y2O3, La2O3 and Ta2O5, where 1.5≤x≤2.8; and the material of the active layer is one of IGZO, ZnON, ITZO, ZTO, ZIO, IGO and AZTO, and an oxygen content in a deposition atmosphere during forming the active layer by deposition is less than 20%.

3. The thin film transistor according to claim 2, wherein the gate insulating layer comprises at least two film layers, wherein the material of one film layer not in contact with the active layer is one of SiOx, Al2O3, HfO2, ZrO2, TiO2, Y2O3, La2O3, Ta2O5, SiNx and SiON, where x≤2.8.

4. The thin film transistor according to claim 1, wherein the etch stop layer comprises at least one film layer, and the material of each film layer is one of SiOx, SiNx, SiON, Al2O3, and TEOS, where x<1.5.

5. An array substrate, comprising the thin film transistor according to claim 1.

6. The array substrate according to claim 5, further comprising a passivation layer located on the thin film transistor and a transparent conducting layer located on the passivation layer, the passivation layer comprising at least one film layer.

7. The array substrate according to claim 6, wherein the transparent conducting layer comprises a pixel electrode, the array substrate further comprises a first via hole penetrating through the passivation layer, and the pixel electrode is electrically connected to the a drain of the thin film transistor through the first via hole.

8. The array substrate according to claim 7, wherein the passivation layer comprises three film layers, the first via hole comprises a first portion and a second portion which are provided up and down, the first portion penetrates through two film layers of the passivation layer, the second portion penetrates through one film layer of the passivation layer, and an aspect ratio of the first portion of the first via hole is larger than that of the second portion of the first via hole.

9. The array substrate according to claim 8, wherein a ratio of the aspect ratio of the first portion of the first via hole to the aspect ratio of the second portion of the first via hole is between 1.5 and 5.

10. The array substrate according to claim 6, wherein the transparent conducting layer comprises a first wiring located within a peripheral region of the array substrate, the array substrate further comprises a second wiring located within the peripheral region and a second via hole penetrating through the passivation layer and the gate insulating layer, the second wiring and a gate of the thin film transistor are provided in a same layer, and the first wiring is electrically connected to the second wiring through the second via hole.

11. The array substrate according to claim 10, wherein the passivation layer comprises three film layers, the second via hole comprises a first portion and a second portion which are provided up and down, the first portion penetrates through two film layers of the passivation layer, the second portion penetrates through one film layer of the passivation layer and the gate insulating layer, and an aspect ratio of the first portion of the second via hole is larger than that of the second portion of the second via hole.

12. The array substrate according to claim 11, wherein a ratio of the aspect ratio of the first portion of the second via hole to the aspect ratio of the second portion of the second via hole is between 1.5 and 5.

13. A display device, comprising the array substrate according to claim 5.

14. A manufacturing method for a thin film transistor, comprising:

forming a gate metal layer on a base substrate, and then forming a pattern comprising a gate by a patterning process;

forming a gate insulating layer on the base substrate with the pattern comprising the gate formed thereon;

forming a metal oxide semiconductor layer on the base substrate with the gate insulating layer formed thereon, and then forming a pattern comprising an active layer by a patterning process;

forming a source/drain metal layer on the base substrate with the pattern comprising the active layer formed thereon, and then forming a pattern comprising a source and a drain by a patterning process, so as to form a thin film transistor, wherein the gate insulating layer conveys oxygen to the active layer so as to reduce an interface state density and a movable impurity concentration of a contact interface between the active layer and the gate insulating layer, wherein after forming the pattern comprising the active layer and before forming the source/drain metal layer, the manufacturing method further comprises: forming an etch stop film on the base substrate with the pattern comprising the active layer formed thereon, and then forming an etch stop layer on a channel region serving as a channel of the active layer by a patterning process.

15. The manufacturing method for a thin film transistor according to claim 14, wherein the gate insulating layer comprises at least one film layer, and the material of one film layer of the gate insulating layer in contact with the active layer is one of SiOx, Al2O3, HfO2, ZrO2, TiO2, Y2O3, La2O3 and Ta2O5, where 1.5≤x≤2.8; and the material of the active layer is one of IGZO, ZnON, ITZO, ZTO, ZIO, IGO and AZTO, the metal oxide semiconductor layer is formed on the base substrate with the gate insulating layer formed thereon by a deposition method, and an oxygen content in a deposition atmosphere during forming the metal oxide semiconductor layer by deposition is less than 20%.

16. The manufacturing method for a thin film transistor according to claim 15, wherein the gate insulating layer is formed on the base substrate with the pattern comprising the gate formed thereon by a chemical vapor deposition method, wherein a ratio of flow rates of N2O to SiH4 in the deposition atmosphere during forming the gate insulating layer by deposition is larger than 60; and the metal oxide semiconductor layer is formed on the base substrate with the gate insulating layer formed thereon by a sputtering deposition method, wherein a ratio of flow rates of O2 to Ar in the deposition atmosphere during forming the metal oxide semiconductor layer by deposition is between 1/20 and 1/7.

17. A manufacturing method for an array substrate, comprising the manufacturing method for a thin film transistor according to claim 14.

18. The manufacturing method for an array substrate according to claim 17, further comprising:
forming a passivation layer on the base substrate with the thin film transistor formed thereon, the passivation layer comprising at least one film layer; and
forming a transparent conducting film on the base substrate with the passivation layer formed thereon, and then forming a transparent conducting layer by a patterning process.

19. The manufacturing method for an array substrate according to claim 18, wherein the transparent conducting layer comprises a pixel electrode, and after forming the passivation layer and before forming the transparent conducting layer, the manufacturing method further comprises: forming a first via hole penetrating through the passivation layer, the pixel electrode being electrically connected to a drain of the thin film transistor through the first via hole.

20. The manufacturing method for an array substrate according to claim 19, wherein the passivation layer comprises three film layers, and forming a first via hole penetrating through the passivation layer comprises:
performing a wet etching on the passivation layer, wherein two film layers of the passivation layer are etched during the wet etching to form a first portion of the first via hole; and
performing a dry etching on one film layer of the passivation layer below the first portion of the first via hole to form a second portion of the first via hole;
wherein an aspect ratio of the first portion of the first via hole is larger than that of the second portion of the first via hole.

21. The manufacturing method for an array substrate according to claim 18, wherein the transparent conducting layer comprises a first wiring located within a peripheral region of the array substrate, and a second wiring located within the peripheral region of the array substrate is formed while forming the gate; and
after forming the passivation layer and before forming the transparent conducting layer, the manufacturing method further comprises: forming a second via hole penetrating through the passivation layer and the gate insulating layer, the first wiring being electrically connected to the second wiring through the second via hole.

22. The manufacturing method for an array substrate according to claim 21, wherein the passivation layer comprises three film layers, and forming a second via hole penetrating through the passivation layer and the gate insulating layer comprises:
performing a wet etching on the passivation layer, wherein two film layers of the passivation layer are etched during the wet etching to form a first portion of the second via hole; and
performing a dry etching on one film layer of the passivation layer below the first portion of the second via hole and the gate insulating layer to form a second portion of the second via hole;
wherein an aspect ratio of the first portion of the second via hole is larger than that of the second portion of the second portion.

23. The manufacturing method for an array substrate according to claim 18, wherein after forming the transparent conducting layer, the manufacturing method further comprises:
annealing the array substrate.

24. The manufacturing method for an array substrate according to claim 23, wherein the annealing temperature is between 120° C. and 450° C., the annealing time is between 0.5 and 3 hours, and the annealing environment is vacuum, nitrogen, air or oxygen.

* * * * *